United States Patent [19]

McDonald et al.

[11] Patent Number: 5,659,885
[45] Date of Patent: Aug. 19, 1997

[54] RADIO FREQUENCY SWITCH INCLUDING VOLTAGE MULTIPLIER

[75] Inventors: Mark Douglas McDonald, Fremont; Paul Anthony Denny, Cupertino; Thai Minh Nguyen, Santa Clara, all of Calif.; David Edward Bien, Tucson, Ariz.

[73] Assignee: National Semiconductor Corporation, Santa Clara, Calif.

[21] Appl. No.: 326,406

[22] Filed: Oct. 20, 1994

[51] Int. Cl.[6] ............................................. H04B 1/44
[52] U.S. Cl. ............................................. 455/78; 327/427
[58] Field of Search ................................ 455/78, 79, 80, 455/81, 82, 83; 327/356, 390, 408, 416, 589, 427

[56] References Cited

U.S. PATENT DOCUMENTS

| | | | |
|---|---|---|---|
| 4,430,756 | 2/1984 | Dolman et al. | 455/78 |
| 5,047,674 | 9/1991 | Clark et al. | 455/78 |
| 5,258,662 | 11/1993 | Skovmand | 327/427 |
| 5,426,334 | 6/1995 | Skovmand | 327/427 |

*Primary Examiner*—Edward F. Urban
*Attorney, Agent, or Firm*—Skjerven, Morrill, MacPherson, Franklin & Friel; David E. Steuber

[57] ABSTRACT

A radio frequency switch includes a field-effect-transistor (FET) having a gate connected to a voltage multiplier. The control voltage for the switch is delivered to the voltage multiplier which delivers an increased gate voltage to turn the switch on. The voltage multiplier is driven by fluctuations of the control voltage as a transceiver, for example, is switched from the transmit to the receive mode.

6 Claims, 7 Drawing Sheets

RADIO FREQUENCY SWITCH INCLUDING VOLTAGE MULTIPLIER

FIELD OF THE INVENTION

This invention relates to an improved semiconductor switch which is particularly suitable for switching the transmitter and receiver in a radio frequency transceiver.

BACKGROUND OF THE INVENTION

In radio frequency transceivers, it is necessary to provide a switching function which alternately connects the transmitter or receiver to the antenna. During transmission, the transmitter is connected to the antenna, and the receiver is disconnected from the antenna. During reception, the receiver is connected to the antenna, and the transmitter is disconnected from the antenna. If the transmitter and receiver were connected simultaneously to the antenna, the relatively large power output from the transmitter could damage the receiver.

An ideal switch for this purpose should introduce minimal loss in the transmit or receive channel when it is turned on (e.g., less than 1 dB). The switch should also have good isolation characteristics, which is to say that the leakage through the switch should be minimal when the switch is turned off. Finally, the switch should consume minimal power and should possess a good input/output power handling capability, i.e., the input power versus output power should be as linear as possible.

A simple MOSFET switch, as illustrated in FIG. 1, may be used for this purpose. $RF_{in}$ represents the incoming radio frequency signal and $RF_{out}$ represents the outgoing radio frequency signal. The problem with this configuration is that, particularly in wireless applications, the available supply voltage is limited. Referring to FIG. 1, this means that $V_{control}$ could be limited to, for example, 3 V. As $RF_{in}$ approaches $V_{control}$, the drain current and thus the power handling capabilities of MOSFET M1 are restricted.

One possible solution is to add a parallel P-channel MOSFET, as shown in FIG. 2. In the arrangement shown in FIG. 2, a P-channel MOSFET P1, whose gate is driven through an inverter 20, essentially takes over most of the current and power handling requirements of the switch when MOSFET M1 is operating with a limited gate-to-source voltage. Conversely, when MOSFET P1 is restricted, MOSFET M1 absorbs most of the power handling requirements.

A possible problem with the arrangement of FIG. 2 is that the combined parasitic capacitance of MOSFETs M1 and P1 may become excessive, leading to large losses at high frequencies. This is particularly true because P-channel MOSFET P1 must normally be larger than N-channel MOSFET M1 in order to obtain an equivalent on resistance, and this further increases the parasitic capacitance of the device. In general, the parasitic capacitance of the switch illustrated in FIG. 2 might be on the order of three times that of the switch illustrated in FIG. 1.

Accordingly, what is required is a radio frequency switch which has an acceptable level of parasitic capacitance while providing good power handling capabilities as $RF_{in}$ approaches $V_{control}$.

SUMMARY OF THE INVENTION

In the radio frequency switch of this invention, a voltage multiplier circuit is connected to the gate of a field-effect-transistor (FET) switch. The voltage multiplier is driven by the control voltage $V_{control}$. The voltage multiplier circuit is driven by the fluctuations of $V_{control}$ as it switches the FET switch on and off. In a preferred embodiment, the voltage multiplier delivers a voltage to the gate of the FET switch that is approximately equal to two times $V_{control}$.

An advantage of using $V_{control}$ to drive the voltage multiplier is that no additional noise is generated as it would be, for example, if the voltage multiplier were driven by a separate oscillator. In some applications, however, it may be advantageous to drive the voltage multiplier with an oscillator.

The radio frequency switch of this invention can be in the form of a single-pole single-throw switch, or a plurality of switches can be connected into various other forms such as single-pole double-throw or double-pole double-throw.

In an alternative embodiment, an oscillator is connected to the voltage multiplier, the voltage multiplier being driven by the oscillator.

DESCRIPTION OF THE INVENTION

Figure 1:
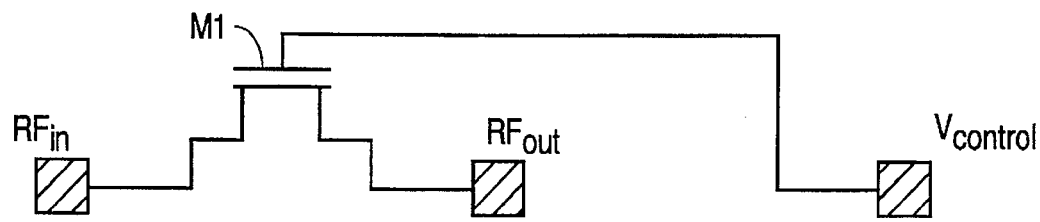
FIG. 1 illustrates a conventional MOSFET switch which is used to switch the transmitter and receiver in a radio transceiver.
Figure 2:
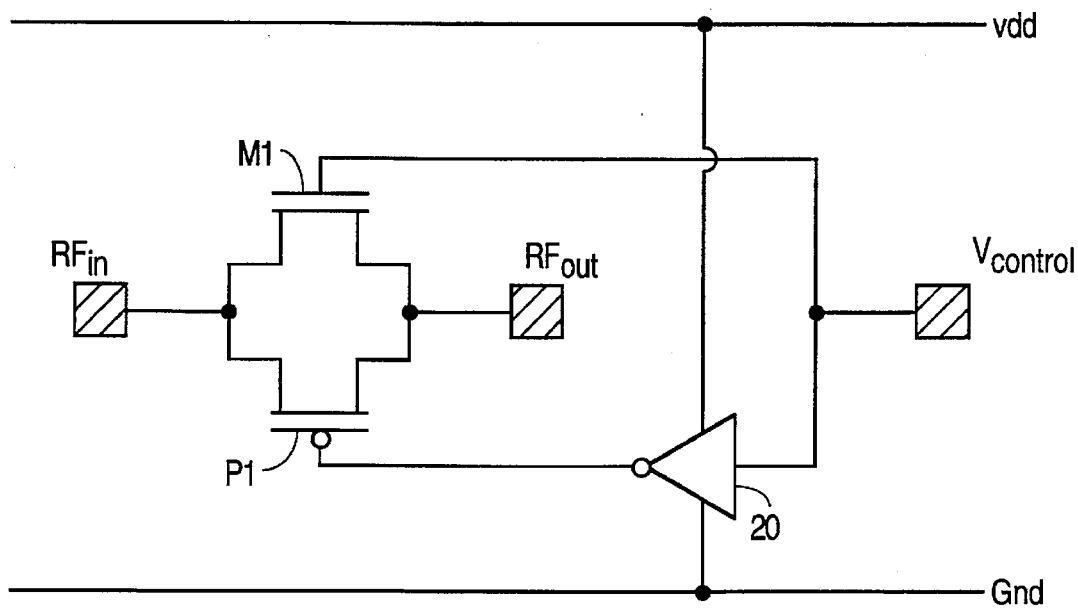
FIG. 2 illustrates a known modified switch in which a P-channel MOSFET is connected in parallel with an N-channel MOSFET.
Figure 3:
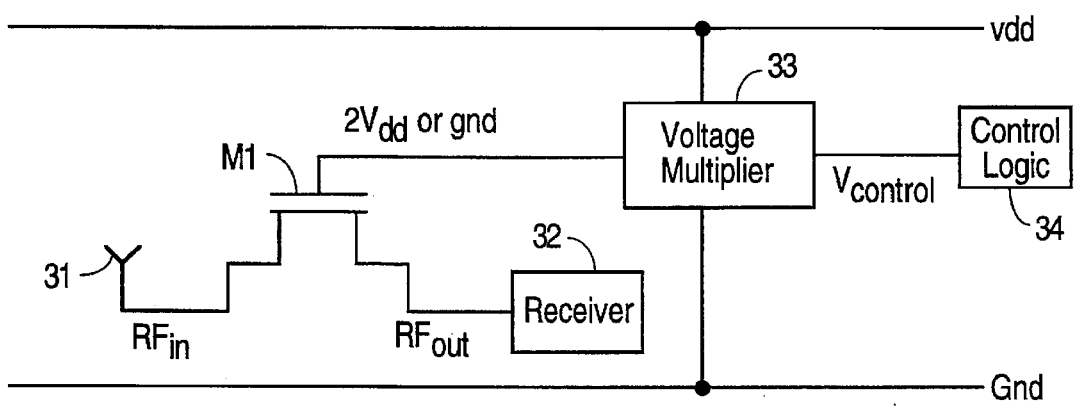
FIG. 3 illustrates a basic block diagram of a radio frequency switch in accordance with this invention.

FIG. 3 illustrates N-channel MOSFET M1 connected between a transceiver antenna 31 and a transmitter or receiver 32. A voltage multiplier 33 is connected to the gate of MOSFET M1. Voltage multiplier 33 is driven by a control voltage $V_{control}$ which is generated by control logic 34 of the transceiver. Voltage multiplier 33 is supplied by a supply voltage $V_{dd}$. As a result of voltage multiplier 33, the gate voltage $V_g$ of MOSFET M1 fluctuates between a voltage approximately equal to 2 $V_{dd}$, when MOSFET M1 is turned on, and 0 V (ground), when MOSFET M1 is turned off. This greatly improves the current and power handling capabilities of MOSFET M1 since the gate-to-source voltage of MOSFET M1 ($V_{gs}$) is maintained at a significantly higher level than if $V_g$ were limited to $V_{dd}$.

Figure 4A:
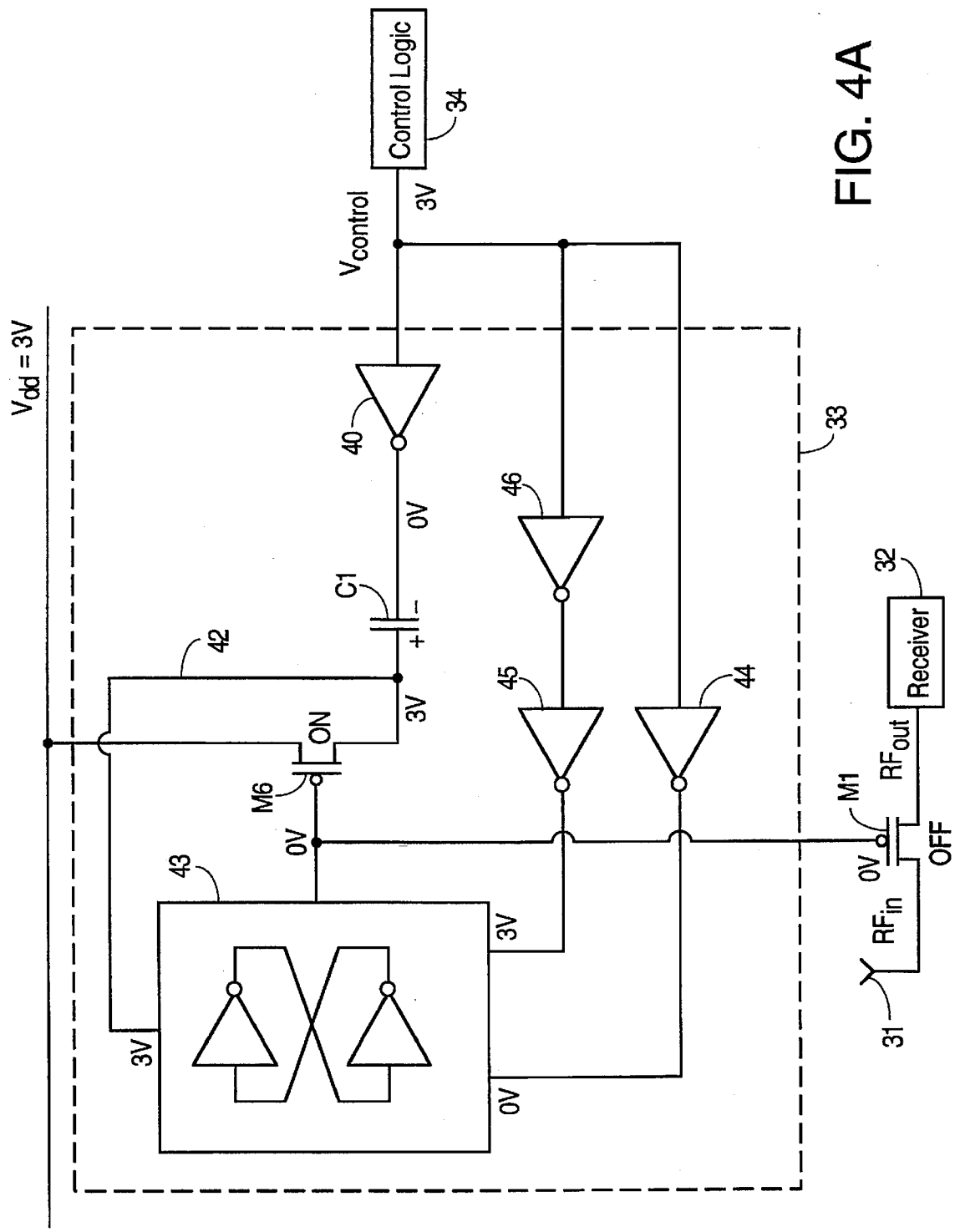
FIGS. 4A and 4B illustrate a logic diagram of a radio frequency switch in accordance with this invention in an off state and an on state, respectively.
Figure 4B:
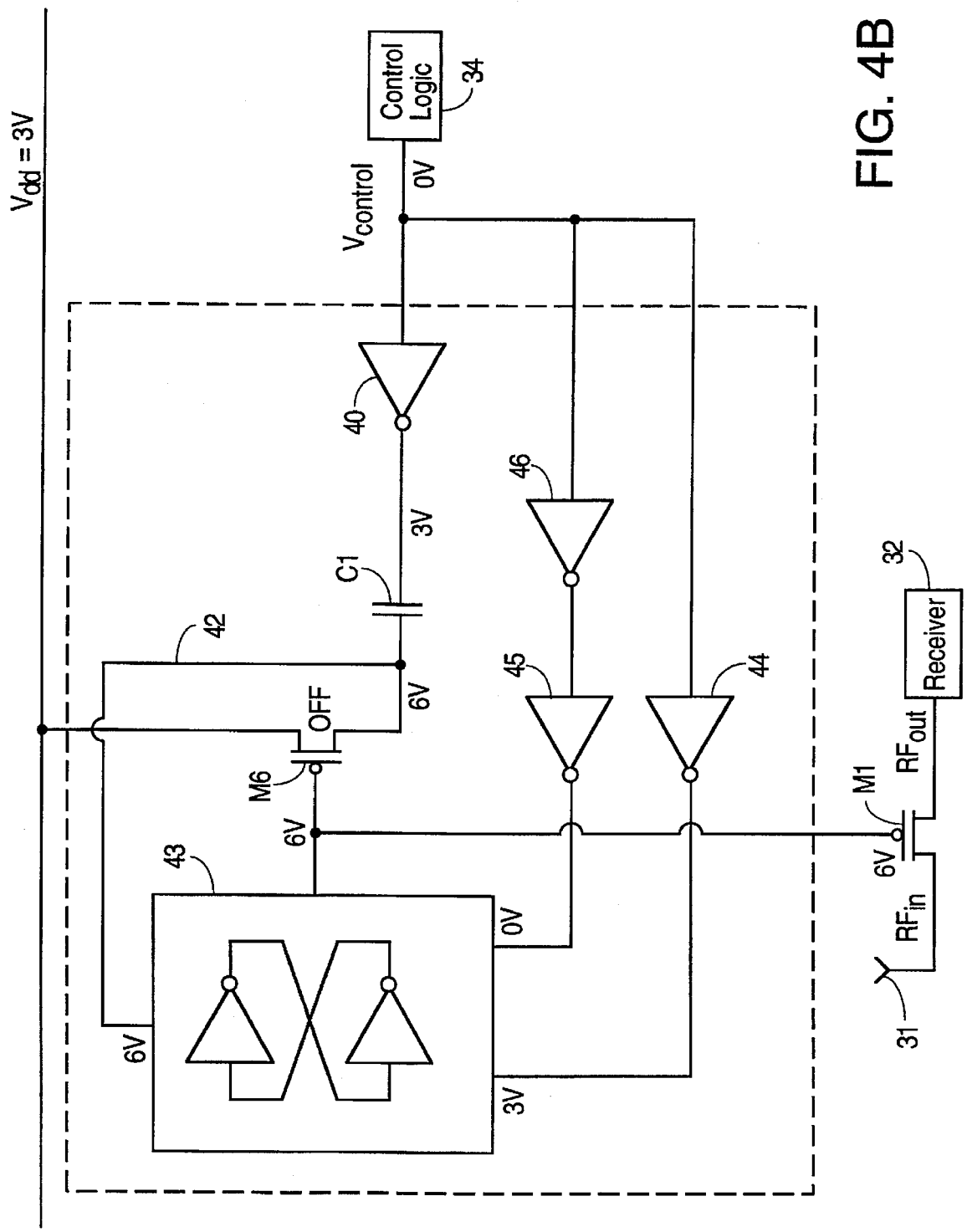

FIGS. 4A and 4B illustrate a more detailed block diagram of voltage multiplier 33. FIG. 4A shows exemplary voltages and other circuit conditions when MOSFET M1 is turned off; FIG. 4B shows voltages and other circuit conditions when MOSFET M1 is turned on. It is assumed that $V_{dd}$=3 V and that $V_{control}$ fluctuates between 3 V when MOSFET M1 is turned off to zero (ground) when MOSFET M1 is turned on.

Control logic 34 is connected through an inverter 40 to one side of a capacitor C1. The other side of capacitor C1 is connected through a P-channel MOSFET M6 to the supply voltage $V_{dd}$ and via a wire 42 to the power-supply input of a set-reset flip-flop 43. Control logic 34 is also connected to the set input of flip-flop 43 through an inverter 44 and to the reset input of flip-flop 43 through serially connected inverters 45 and 46. The gate of MOSFET M6 is connected to the output of flip-flop 43 and to the gate of MOSFET M1.

FIG. 4A illustrates the status of this circuit when $V_{control}$ is at 3 V and the output has cycled at least once. Since the output of inverter 44 is at 0 V and the output of inverter 45 is at 3 V, flip-flop 43 is reset. Therefore, the output of flip-flop 43 is at 0 V, turning P-channel MOSFET M6 on. This connects $V_{dd}$=3 V to the power-supply input of flip-flop 43. Since the output of inverter 40 is at 0 V, capacitor C1 is biased at 3 V.

Thus, with voltage multiplier 33 in the state shown in FIG. 4A, the gate of MOSFET M1 is biased at 0 V, and MOSFET M1 is turned off.

When $V_{control}$ switches to 0 V, voltage multiplier 33 switches to the condition shown in FIG. 4B. The output of inverter 44 is now at 3 V, and flip-flop 43 is set. The output of inverter 40 is at 3 V. Since capacitor C1 takes time to discharge, the voltage at the other side of capacitor C1 rises to approximately 6 V when $V_{control}$ switches from 3 V to 0 V. With flip-flop 43 now set, this 6 V voltage is delivered to the power-supply input of flip-flop 43 via wire 42 and appears at the output of flip-flop 43. Since 6 V is delivered to the gate of P-channel MOSFET M6, MOSFET M6 is turned off. Accordingly, 6 V appears at the gate of MOSFET M1, turning MOSFET M1 on.

When $V_{control}$ again goes to 3 V, voltage multiplier 33 again assumes the condition shown in FIG. 4A. In digital communications systems, a transceiver is continually switched from transmit to receive and back to transmit. In a time multiplexed system, each transceiver may be allocated only a single channel, and will be switched to the transmit mode, for example, only during a small portion of the time. Capacitor C1 must be large enough to maintain a voltage of approximately 6 V at the power-supply input of flip-flop 43 during the time that MOSFET M1 is to be turned on.

Figure 5:
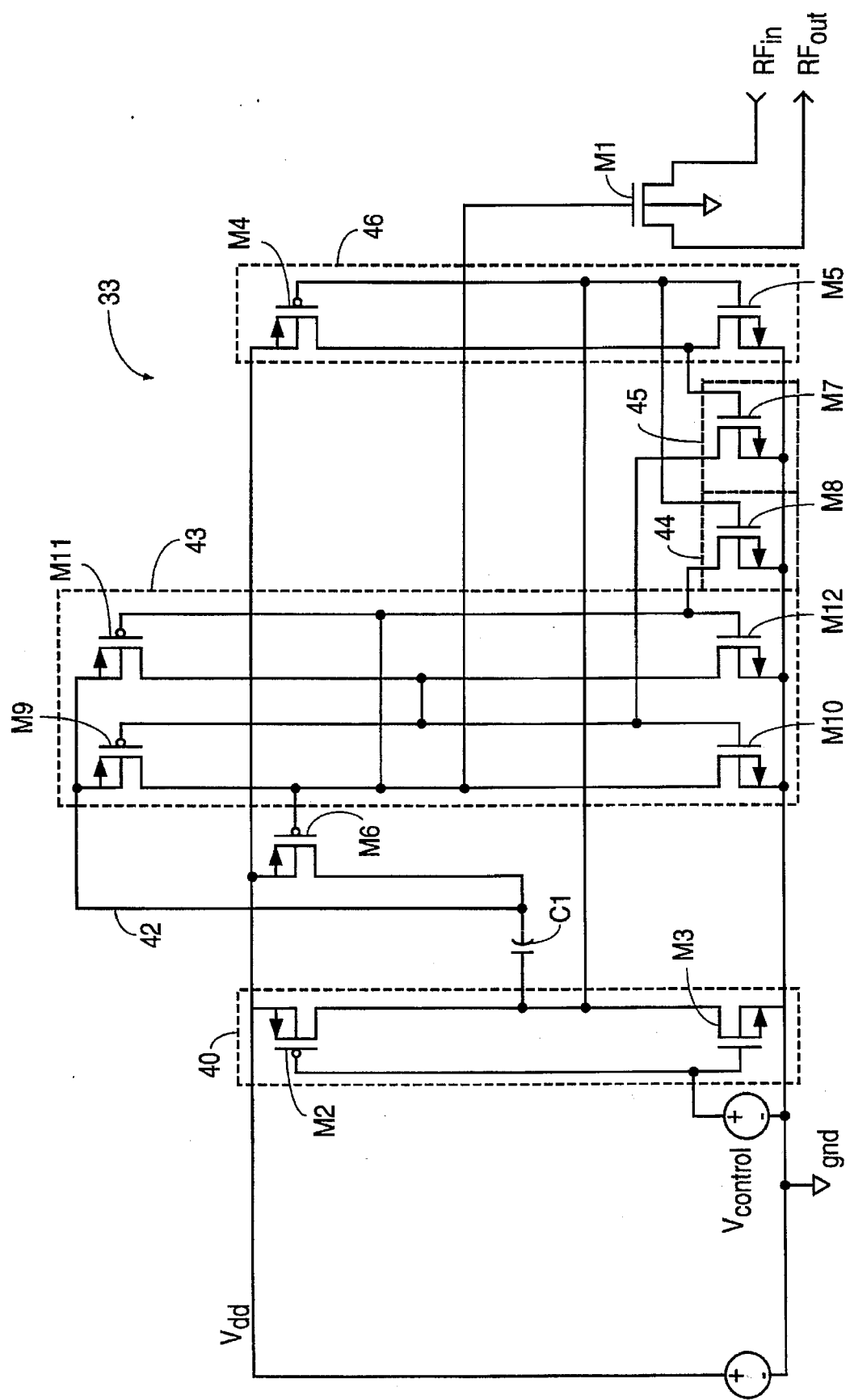
FIG. 5 illustrates a circuit diagram of the radio frequency switch of this invention.

FIG. 5 illustrates a circuit diagram of voltage multiplier 33. $V_{control}$ is delivered to the gates of a P-channel MOSFET M2 and an N-channel MOSFET M3 which together form inverter 40. The output of inverter 40 is generated at the common drains of MOSFETs M2 and M3 and is delivered to one side of capacitor C1. The other side of capacitor C1 is connected to the drain of MOSFET M6.

$V_{control}$ is also delivered to the gates of a P-channel MOSFET M4 and an N-channel MOSFET M5, which together form inverter 46. The common drains of MOSFETs M4 and M5 are connected to the gate of a MOSFET M7 which forms inverter 45. $V_{control}$ is also connected to the gate of a MOSFET M8 which forms inverter 44.

Set-reset flip-flop 43 includes a P-channel MOSFET M9 and an N-channel MOSFET M10 which together form an inverter, and a P-channel MOSFET M11 and an N-channel MOSFET M12 which together form a second inverter. The input of each of these inverters is connected to the output of the other inverter. The output of the inverter which includes MOSFETs M9 and M10 and the input of the inverter which includes MOSFETs M11 and M12 are connected to the gate of MOSFET M1.

Figure 6:
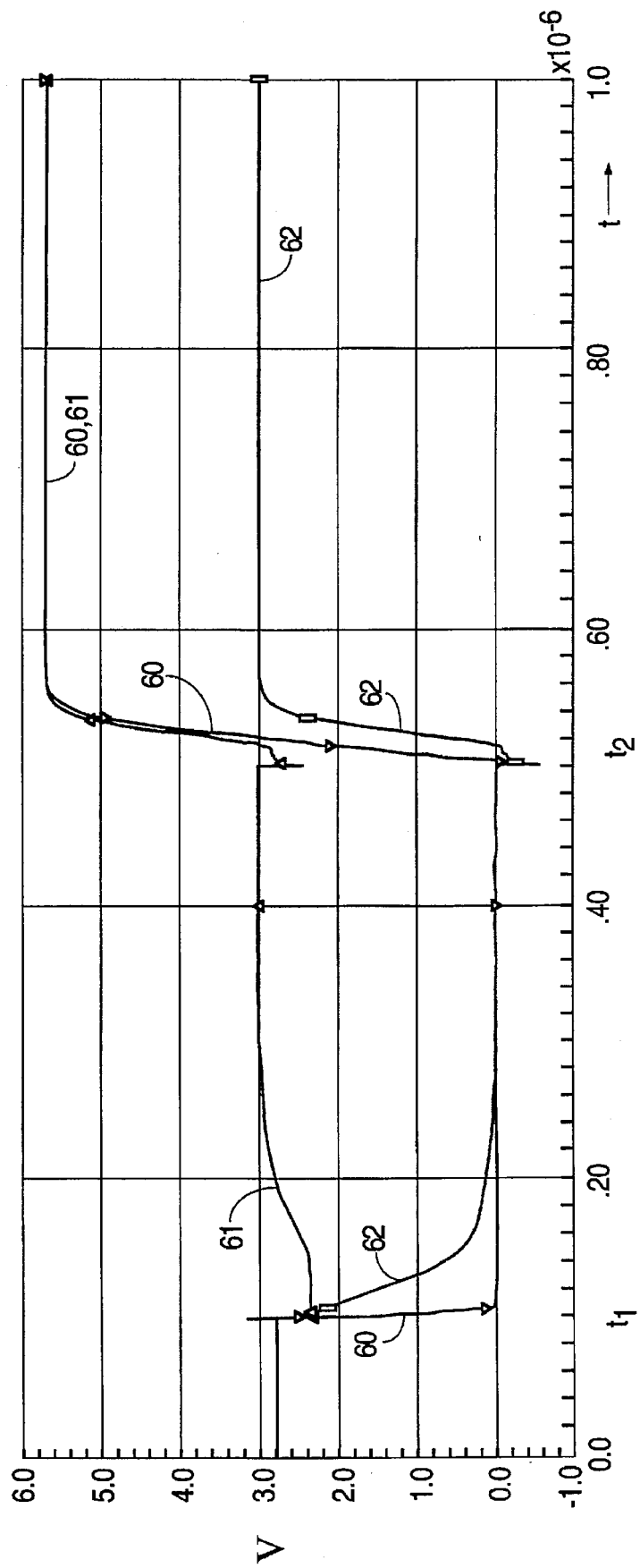
FIGS. 6 and 7 illustrate the results of simulated tests of the radio frequency switch.
Figure 7:
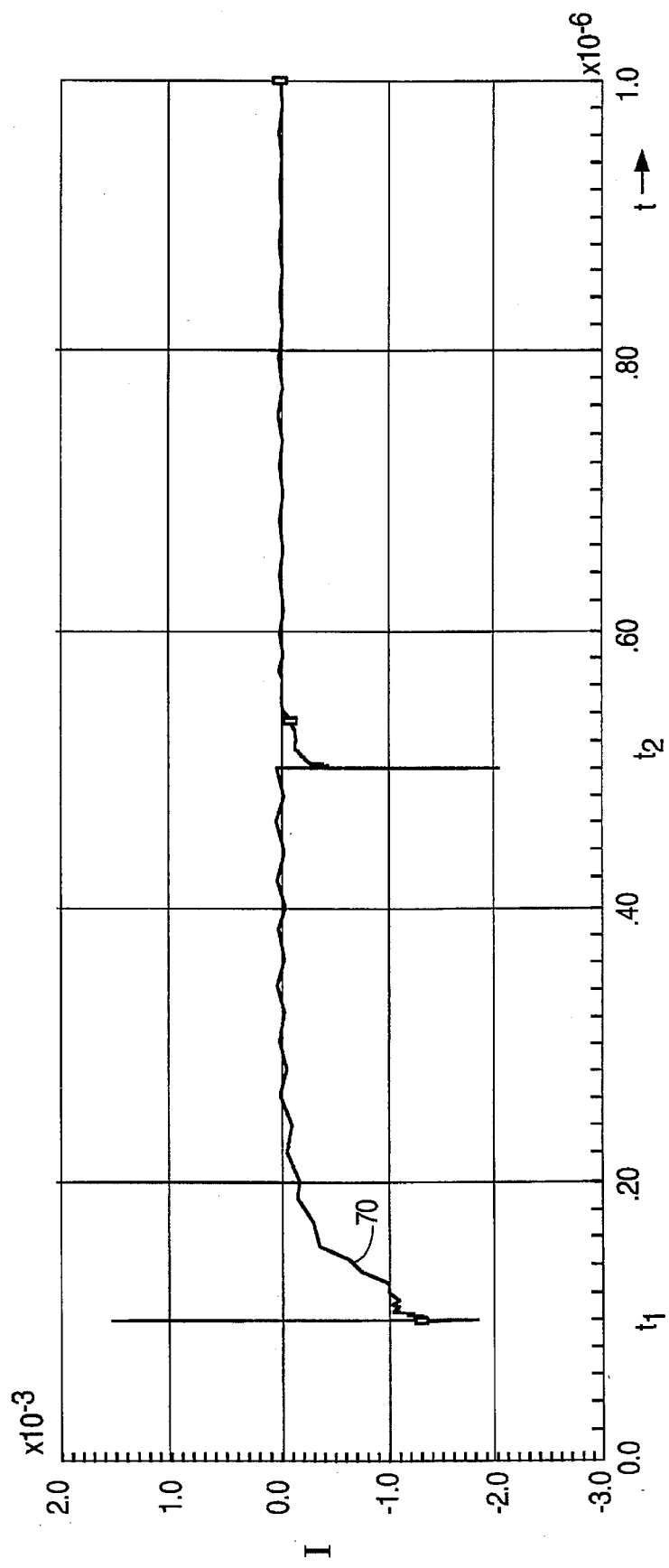

FIGS. 6 and 7 illustrate simulated results of tests on a radio frequency switch in accordance with this invention. With regard to FIG. 6, the vertical axis represents voltage and the horizontal axis represents time. At time $t_1$ the MOSFET switch was turned off and at time $t_2$ the MOSFET switch was turned on. Curve 60 represents the voltage at the gate of the MOSFET switch and curves 61 and 62 represent the voltage at the left and right sides, respectively, of capacitor C1 (FIGS. 4A and 4B). As shown, when the switch is turned off ($t_1$) the voltage at the gate of MOSFET M1 falls rapidly to zero and when the switch is turned on ($t_2$) the voltage at the gate of MOSFET M1 rises rapidly to a level just below 6 V, where it remains steady. Curve 61 shows that the voltage at the left side of capacitor C1 rises to 3 V when the switch is turned off and rises rapidly almost to 6 V when the switch is turned on. Curve 62 shows that the voltage at the right side of capacitor C1 (i.e., the output of invertor 40) falls to 0 V when the switch is turned off and rises to 3 V when the switch is turned on. It should be noted that the noise generated by the voltage multiplier is limited mainly to the switching times when it is not likely to create problems.

FIG. 7 illustrates, as curve 70, the supply current consumed by voltage multiplier 33. The horizontal axis is the same as in FIG. 6; the vertical axis is current, which is represented as the negative of the current flowing out of the positive supply ($V_{dd}$). Except for some brief spikes which occur at the switching transitions, the supply current remains very close to zero, indicating that the power consumption of the voltage multiplier is very low.

Figure 8:
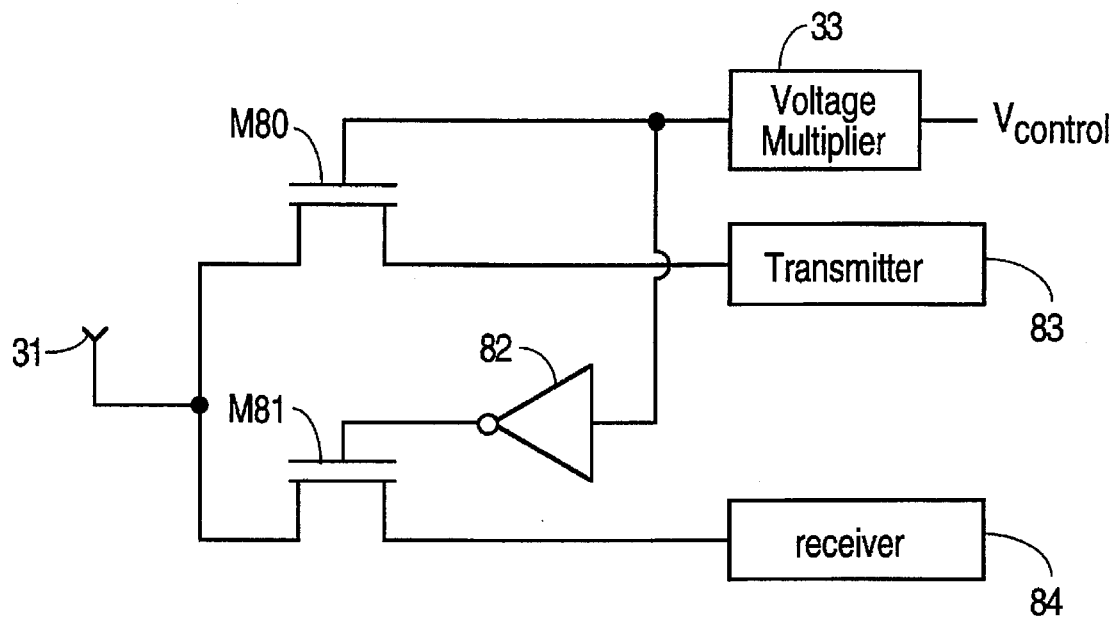
FIG. 8 illustrates a single-pole double-throw switch using the MOSFET switch of this invention.

The MOSFET switch of this invention can be connected in numerous configurations to control the switching functions in a radio transceiver. For example, FIG. 8 shows a transmitter 83 connected via a MOSFET switch M80 to antenna 31 and a receiver 84 connected via a MOSFET switch M81 to antenna 31. $V_{control}$ flows through voltage multiplier 33 to the gate of MOSFET M80 and through an inverter 82 to the gate of MOSFET M81. Thus, the configuration shown in FIG. 8 operates as a single-pole double-throw switch alternately connecting transmitter 83 or receiver 84 to antenna 31.

Figure 9:
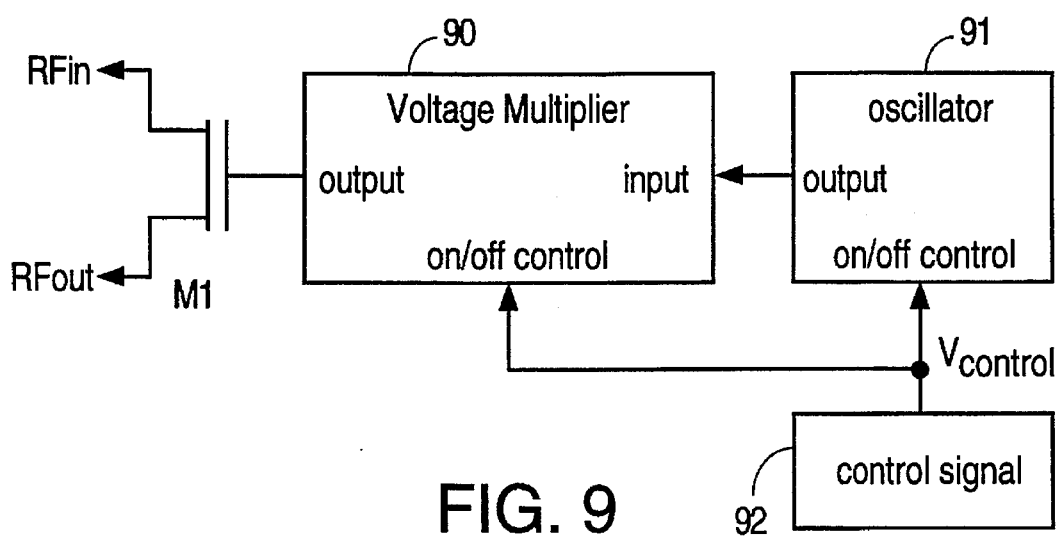
FIG. 9 illustrates an alternative embodiment, in which the voltage multiplier is driven by an oscillator.

In addition, the voltage multiplier may be driven by an oscillator rather than $V_{control}$. FIG. 9 shows an embodiment in which the MOSFET M1 is driven by a voltage multiplier 90, which could be any conventional type of voltage multiplier. Voltage multiplier 90 is driven by an oscillator 91. Both voltage multiplier 90 and oscillator 91 are controlled by control signals that are generated by control logic 92. Voltage multiplier 90 supplies a multiple of the supply voltage $V_{dd}$ to the gate of MOSFET M1.

While specific embodiments according to this invention have been described above, it will be apparent to those skilled in the art that numerous alternative embodiments are possible within the broad scope of this invention, as defined in the following claims. For example, while the embodiment described above includes a MOSFET switch, Other types of FET switches could be used in place of the MOSFET, including JFETs, GaAs FETs, HEMTs (high electron mobility transistors) and PHEMTs (pseudomorphic high electron mobility transistors).

We claim:

1. A radio frequency unit comprising:
   a control logic unit;
   a voltage multiplier; and
   a field-effect-transistor (FET) switch;
   said voltage multiplier being connected between said control logic unit and a gate of said FET switch so as to bias said gate at a multiple of a supply voltage when said FET switch is turned on;
   wherein said voltage multiplier comprises a flip-flop, a capacitor and a FET, said FET being connected between a first side of said capacitor and said supply voltage, said first side of said capacitor being connected to a power-supply input of said flip-flop, a second side of said capacitor being connected to said control logic unit.

2. The radio frequency of claim 1 wherein an output of said flip-flop is connected to a gate of said FET switch.

3. A radio transceiver comprising:

an antenna;

a transmitter;

a receiver;

first and second FET switches;

a voltage multiplier, wherein said voltage multiplier comprises a flip-flop, a capacitor and a FET, said FET being connected between a first side of said capacitor and said supply voltage, said first side of said capacitor being connected to a power-supply input of said flip-flop, a second side of said capacitor being connected to a control logic unit; and a first control voltage and a second control voltage supplied alternately to said voltage multiplier from said control logic unit, each of said first and second control voltages being at a substantially constant level;

said first FET switch being connected between said antenna and said transmitter, said second FET switch being connected between said antenna and said receiver, said voltage multiplier supplying an output voltage to a gate of said first FET switch and an inverted form of said output voltage to a gate of said second FET switch when said control logic unit supplies said first control voltage to said voltage multiplier, said voltage multiplier supplying said output voltage to said gate of said second FET and said inverted form of said output voltage to said gate of said first FET when said control logic unit supplies said second control voltage to said voltage multiplier.

4. The radio transceiver of claim 3 further comprising an inverter connected between said voltage multiplier and one of said first and second FET switches.

5. A method of alternately connecting and disconnecting a radio transmitter and an antenna, said method comprising:

providing a FET switch;

providing a supply voltage;

multiplying said supply voltage in a voltage multiplier, said voltage multiplier being driven by a control voltage which alternates between a first level and a second level, wherein said voltage multiplier further comprises a flip-flop, a capacitor and a FET, said FET being connected between a first side of said capacitor and said supply voltage, said first side of said capacitor being connected to a power-supply input of said flip-flop, a second side of said capacitor being connected to a control logic unit; and applying said multiplied supply voltage to a gate of said FET switch so as to turn said FET switch on and removing said multiplied supply voltage from said gate so as to turn said FET switch off.

6. The method of claim 5 wherein said supply voltage is multiplied by a factor of approximately two.

* * * * *

UNITED STATES PATENT AND TRADEMARK OFFICE
CERTIFICATE OF CORRECTION

PATENT NO.    :   5,659,885
DATED         :   August 19, 1997
INVENTOR(S)   :   Denny, Paul A.; Nguyen, Thai M.; Bien, David E.

It is certified that error appears in the above-identified patent and that said Letters Patent is hereby corrected as shown below:

Column 5, line 6, after "frequency" insert --unit--.

Signed and Sealed this

Third Day of March, 1998

*Attest:*

BRUCE LEHMAN

*Attesting Officer*    *Commissioner of Patents and Trademarks*